United States Patent
Karube (10) Patent No.: US 6,600,435 B2
(45) Date of Patent: Jul. 29, 2003

(54) DIGITAL-ANALOG CONVERTING APPARATUS, SYSTEM, AND METHOD

(75) Inventor: Masao Karube, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/095,916

(22) Filed: Mar. 13, 2002

(65) Prior Publication Data

US 2002/0140595 A1 Oct. 3, 2002

(30) Foreign Application Priority Data

Mar. 13, 2001 (JP) .......................... 2001-070296
Dec. 28, 2001 (JP) .......................... 2001-399978

(51) Int. Cl.[7] .............................................. H03M 1/66
(52) U.S. Cl. ...................................... 341/144; 341/172
(58) Field of Search ................................. 341/172, 144

(56) References Cited

U.S. PATENT DOCUMENTS 6,297,759 B1 * 10/2001 Lewyn ........................ 341/150

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

A digital-analog converting circuit capable of shortening time necessary to digital-analog conversion. The converting circuit includes first switching circuits for turning on/off in accordance with a digital pixel signal, second switching circuits connected to the first switching circuit, first through third capacitors, and third through seventh switching circuits. Electric charges corresponding to the digital pixel signal are accumulated in the second capacitors. When the accumulation of the electric charges is completed, the switching circuit is turned on in order to transfer the accumulated electric charges into the third capacitor. Because of this, during an OFF period of the switching circuit, the third capacitor can hold the electric charge in accordance with the pixel data.

20 Claims, 10 Drawing Sheets

F I G. 1

| SW11 | SW12 | SW13 | SW14 | SW15 | SW16 | VOLTAGE AT d POINT | b0 | b1 | b2 |
|------|------|------|------|------|------|--------------------|----|----|----|
| OFF | ON  | OFF | ON  | OFF | ON  | $V1+7\times(V2-V1)/8$ | V2 | V2 | V2 |
| ON  | OFF | OFF | ON  | OFF | ON  | $V1+6\times(V2-V1)/8$ | V1 | V2 | V2 |
| OFF | ON  | ON  | OFF | OFF | ON  | $V1+5\times(V2-V1)/8$ | V2 | V1 | V2 |
| ON  | OFF | ON  | OFF | OFF | ON  | $V1+4\times(V2-V1)/8$ | V1 | V1 | V2 |
| OFF | ON  | OFF | ON  | ON  | OFF | $V1+3\times(V2-V1)/8$ | V2 | V2 | V1 |
| ON  | OFF | OFF | ON  | ON  | OFF | $V1+2\times(V2-V1)/8$ | V1 | V2 | V1 |
| OFF | ON  | ON  | OFF | ON  | OFF | $V1+1\times(V2-V1)/8$ | V2 | V1 | V1 |
| ON  | OFF | ON  | OFF | ON  | OFF | $V1$ | V1 | V1 | V1 |

| SW11 | SW12 | SW13 | SW14 | SW15 | SW16 | VOLTAGE AT d POINT | b0 | b1 | b2 |
|---|---|---|---|---|---|---|---|---|---|
| OFF | ON | OFF | ON | OFF | ON | V1+7×(V2−V1)/8 | V2 | V2 | V2 |
| ON | OFF | OFF | ON | OFF | ON | V1+6×(V2−V1)/8 | V1 | V2 | V2 |
| OFF | ON | ON | OFF | OFF | ON | V1+5×(V2−V1)/8 | V2 | V1 | V2 |
| ON | OFF | ON | OFF | OFF | ON | V1+4×(V2−V1)/8 | V1 | V1 | V2 |
| OFF | ON | OFF | ON | ON | OFF | V1+3×(V2−V1)/8 | V2 | V2 | V1 |
| ON | OFF | OFF | ON | ON | OFF | V1+2×(V2−V1)/8 | V1 | V2 | V1 |
| OFF | ON | ON | OFF | ON | OFF | V1+1×(V2−V1)/8 | V2 | V1 | V1 |
| ON | OFF | ON | OFF | ON | OFF | (V0+V1)/2 | V1 | V1 | V1 |

DIGITAL-ANALOG CONVERTING APPARATUS, SYSTEM, AND METHOD

CROSS REFERENCE TO RELATED APPLICATIONS

This application is based upon and claims the benefit of priority from the prior Japanese Patent Applications No. 2001-70296 filed on Mar. 13, 2001, and No. 2001-399978 filed on Dec. 28, 2001, the entire contents of which are incorporated herein by reference.

BACKGROUND OF THE INVENTION

1. Field of the Invention

The present invention relates to a digital-analog converting circuit, a display device and a digital-analog signals.

2. Related Background Art

A liquid crystal display has a pixel array part arranged in a matrix form, and drive circuits for driving signal lines and scanning lines. Conventionally, because the pixel array part and the drive circuits have been formed on separate substrates different from each other, it was impossible to reduce cost of the entire liquid crystal display.

Recently, a fabrication technique in which TFTs (Thin Film Transistors) are formed on a glass substrate by using poly-silicon as a material has been developed. If such a technique is applied, it may be technically possible to form the pixel array part and the drive circuit on the same substrate.

An analog pixel voltage has to be supplied to signal lines of the pixel array part. However, the drive circuits are composed of digital components such as gate circuits and flipflops, and perform various signal processings by using the digital signals. Therefore, it is general that a digital-analog converting circuit is provided in the drive circuits and the analog signal converted by the digital-analog converting circuit is applied to the pixel array part.

However, it is currently difficult to form poly-silicon TFTs having uniform properties at high efficiency on the glass substrate. The transistor properties such as a threshold voltage and a mobility may fluctuate largely and the operation speed may become late.

Figure 9:
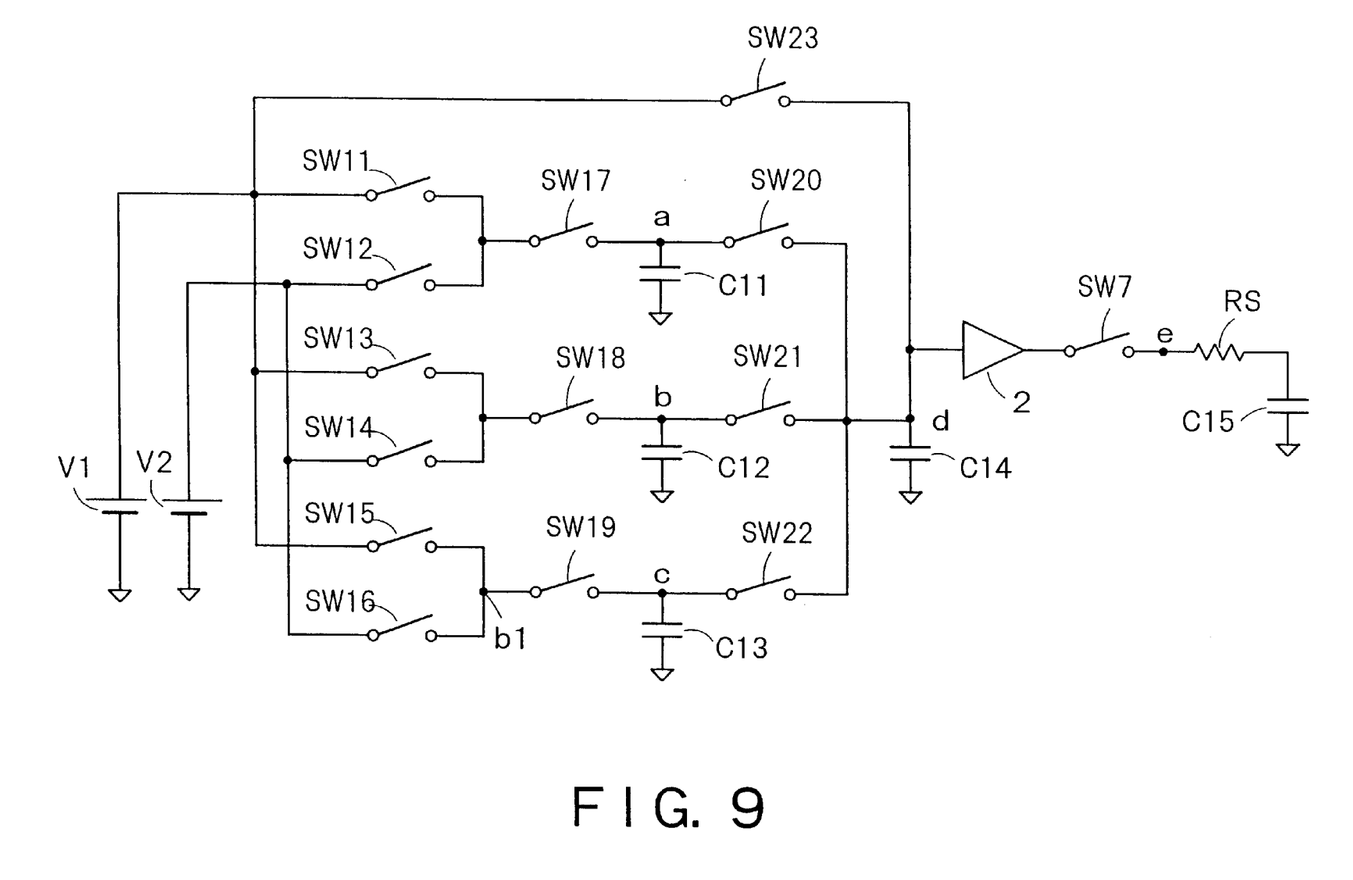
FIG. 9 is a circuit diagram of the conventional digital-analog converting circuit composed of the poly-silicon TFT on the glass substrate.

FIG. 9 is a circuit diagram of the conventional digital-analog converting circuit composed of the poly-silicon TFT on the glass substrate, and shows an example of converting the digital pixel data of 3 bits into the analog voltage. The digital analog converting circuit of FIG. 9 has three sets of switching circuits (SW11, SW12), (SW13, SW14) and (SW15, SW16) provided in accordance with the respective bits of the digital pixel data, switching circuits SW17, SW18 and SW19 connected to these circuits, respectively, capacitors C11, C12 and C13 and switching circuits SW20, SW21 and SW22 connected to these switching circuits SW17, SW18 and SW19, a switching circuit SW23 for selecting either of a first voltage V1 or a second voltage V2, a capacitor C14 connected to the switching circuit SW23, an amplifier 2 connected one end of the capacitor C14, a switching circuit SW7 connected to output end of the amplifier 2, and a capacitor C15 for accumulating electric charge passing through the switching circuit SW7 in accordance with the output voltage of the amplifier 2.

Figure 10:
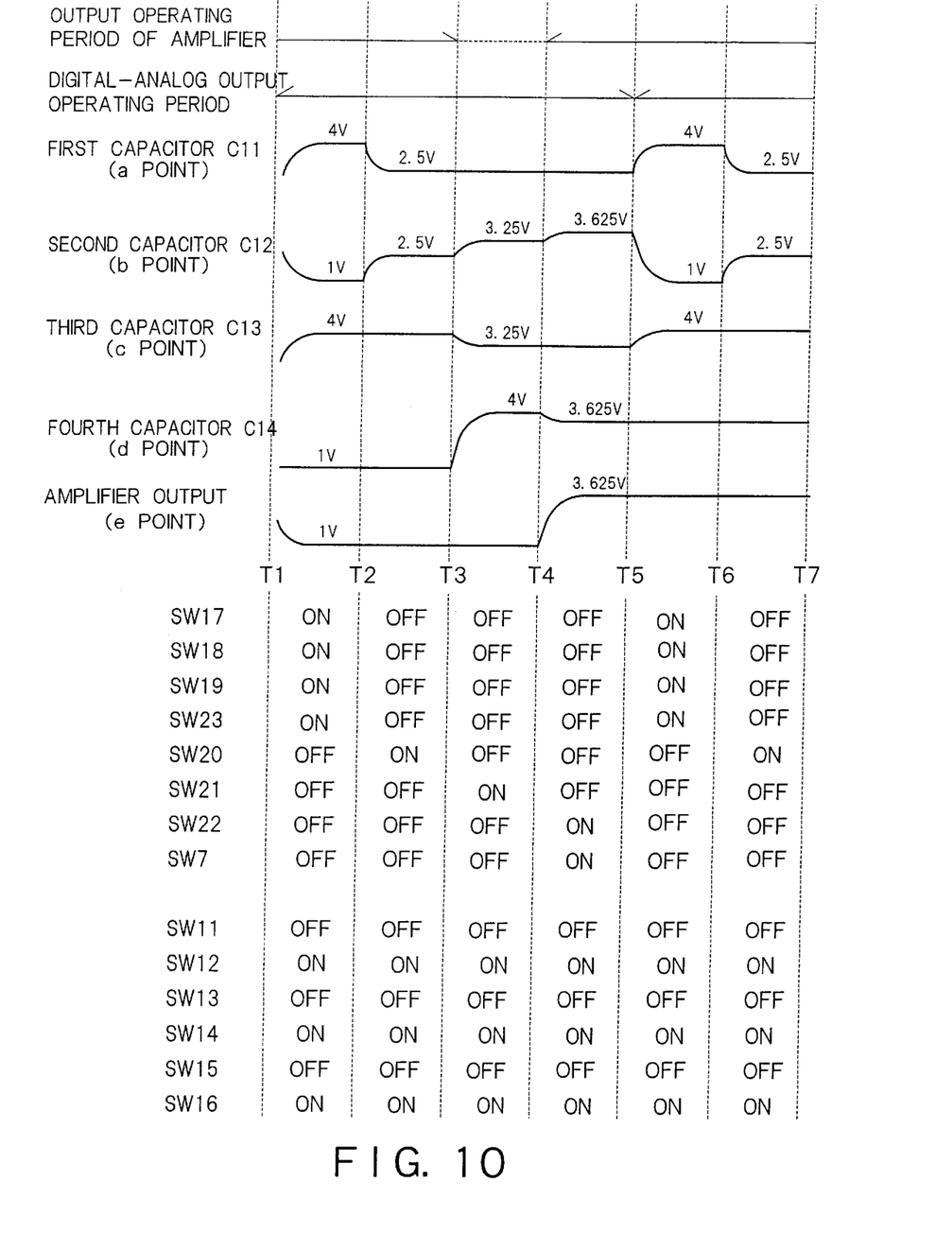
FIG. 10 is a diagram showing voltage waveforms of the respective parts in the circuit of FIG. 9.

FIG. 10 is a diagram showing voltage waveforms of the respective parts in the circuit of FIG. 9 when the digital signals (1, 1, 1) of three bits are inputted. Hereinafter, the operation of the circuit of FIG. 9 will be described with reference to FIG. 10. The first voltage V1 is in 1 volt, and the second voltage V2 is in 4 voltage.

First of all, during time period T1–T2, the switching circuits SW17–SW19 turn on. Therefore, one ends (a, b, c) of the capacitors C11–C13 become 4 volt. Subsequently, during time period T2–T3, the switching circuit SW20 turns on. Therefore, the electric charge moves from the capacitor C11 to the capacitor C14, and one ends (a, d) of the capacitors C11 and C14 become the same voltage (2.5V).

Subsequently, during time period T3–T4, the switching circuit SW21 turns on. Therefore, the electric charge moves from the capacitor C12 to the capacitor C14, and one ends b, d of the capacitors C12 and C14 become the same voltage (3.25V).

Subsequently, during time period T4–T5, the switching circuit SW22 turns on. Therefore, the electric charge moves from the capacitor C13 to the capacitor C14, and one ends (c, d) of the capacitors C13 and C14 become the same voltage (3.625V). At this time, because the switching circuit SW7 also turns on, the electric charge in accordance with the voltage at d point is accumulated into the capacitor C15 via the amplifier 2 and the switching circuit SW7. After time T5, the same operation as that of time period T1–T5 is repeated.

The voltage at d point of FIG. 9 changes gradually during time period T1–T5, and becomes a desired analog voltage at last during time period T4–T5. That is, time length that d point is in the desired analog voltage is short. The switching circuit SW7 can turn on only during time period that d point is in the desired voltage, i.e. time period T4–T5. Accordingly, time period that the output of the analog converting circuit is supplied to the signal line is shorten. Therefore, there is a likelihood that the voltage of the signal line does not fully rise or lower, thereby causing uneven brightness and deteriorating display quality.

SUMMARY OF THE INVENTION

An object of the present invention is to provide a digital-analog converting circuit, a display device and digital-analog converting method having even brightness and improving display quality.

In order to achieve the foregoing object, a digital-analog converting circuit configured to output a voltage between a first and second voltages, said voltage corresponding to a digital signal of n bits (n is an integer more than two), comprising:

a plurality of first capacitors configured to accumulate electric charges in accordance with value of the respective bits except for the most significant bit of said digital signal;

a second capacitor capable of accumulating the electric charge in accordance with said first voltage;

a third capacitor capable of accumulating the electric charge in accordance with the value of the most significant bit of said digital signal;

a switching circuit connected on a current path between said second and third capacitors; and a charge control circuit configured to accumulate the electric charges in accordance with the respective bits except for the most significant bit of said digital signal to the respective fist capacitors, and then transfer the electric charges accumulated to the respective first capacitors into said second capacitor, and accumulate the electric charge in accordance with the most significant bit of said digital signal to said third capacitor, and then turn on said switching circuit in order to transfer the electric charge accumulated to said second capacitor into said third capacitor.

Furthermore, a display device, comprising:

a plurality of switching elements arranged near cross sections of signal lines and scanning lines;

a signal line drive circuit configured to drive the signal lines; and a scanning line drive circuit configured to drive the scanning lines;

wherein said signal line drive circuit has said digital-analog converting circuit according to claim 1 configured to convert a digital signal expressing pixel information into an analog signal;

wherein the output of said digital-analog converting circuit is supplied to the corresponding signal line.

DESCRIPTION OF THE PREFERRED EMBODIMENTS

Hereinafter, a digital-analog converting circuit according to the present invention will be described with reference to drawings. Especially, an example in which the digital-analog converting circuit according to the present invention is applicable for a signal line drive circuit in a liquid crystal display will be described.

(First Embodiment)

Figure 1:
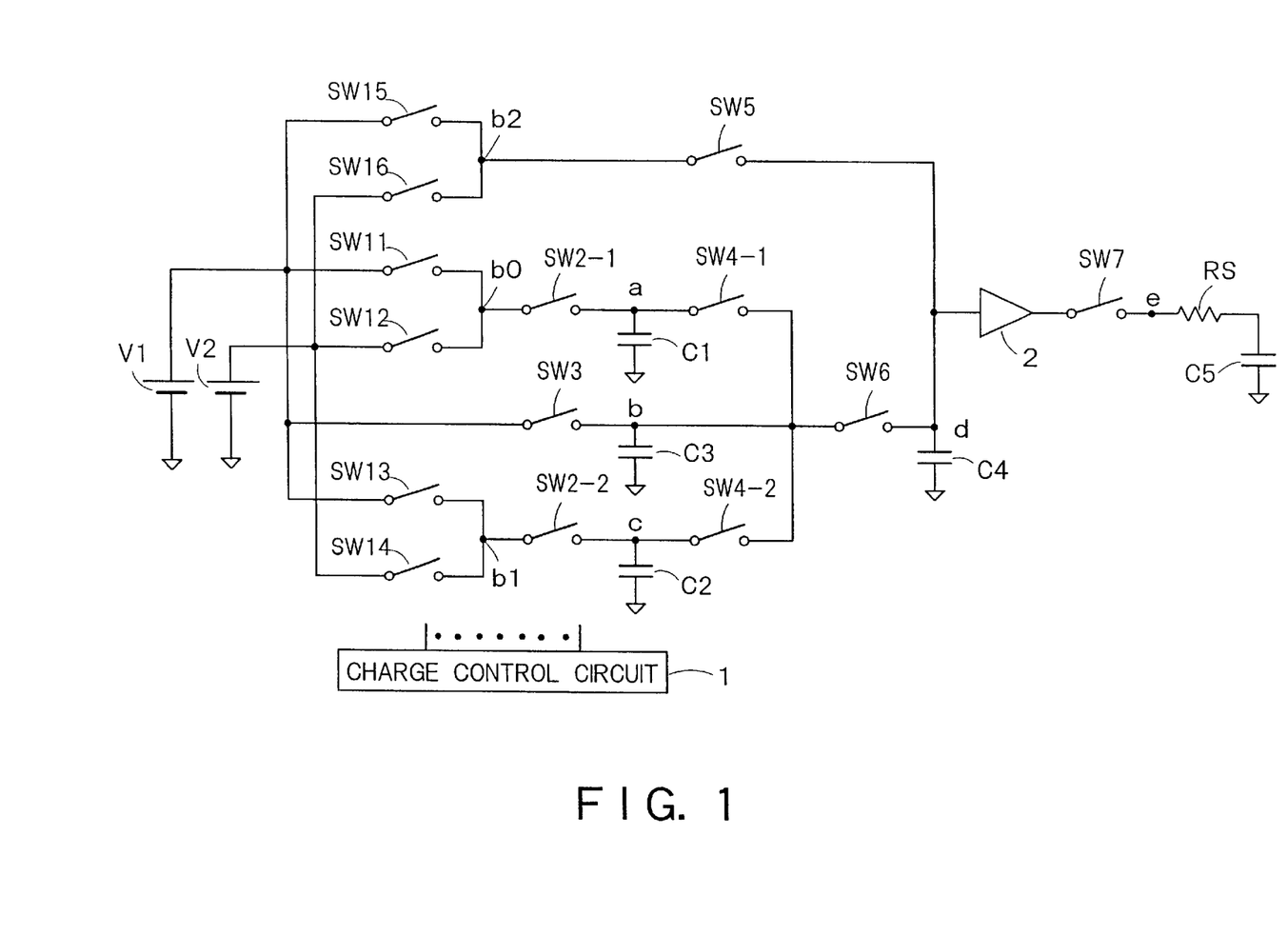
FIG. 1 is a circuit diagram of a first embodiment of a digital-analog converting circuit according to the present invention.

FIG. 1 is a circuit diagram of a first embodiment of a digital-analog converting circuit according to the present invention. The digital-analog converting circuit of FIG. 1 converts 3 bits digital signals (b2, b1, b0) into 8 types of voltages between first and second voltages V1 and V2.

The digital-analog converting circuit of FIG. 1 has three sets of first switching circuits (SW11, SW12), (SW13, SW14) and (SW15, SW16), a plurality of second switching circuits (SW2-1, SW2-2) connected to the first switching circuits corresponding to the respective bits except for the most significant bit of the digital signals (b2, b1, b0), a plurality of first capacitors C1 and C2 for accumulating the electric charges in accordance with the values of the respective bits except for the most significant bit of the digital signals (b2, b1, b0) via the first and second switching circuits, a second capacitor C3 capable of accumulating the electric charge in accordance with the first voltage V1, a third switching circuit SW3 for switching whether or not to accumulate the electric charge in accordance with the first voltage V1 to the second capacitor C3, a fourth switching circuits (SW4-1, SW4-2) for switching whether or not to transfer the electric charge accumulated to the first capacitors C1 and C2 into the second capacitor C3, a third capacitor C4 capable of accumulating the electric charge in accordance with the value of the most significant bit of the digital signals (b2, b1, b0), a fifth switching circuit SW5 for switching whether or not to accumulate the electric charge in accordance with the value of the most significant bit of the digital signals (b2, b1, b0) to the third capacitor C4, a sixth switching circuit SW6 for switching whether or not to transmit the electric charge accumulated to the second capacitor C3 into the third capacitor C4, a charge control circuit 1 for controlling switching of first through sixth switching circuits SW11–SW6, an amplifier 2 for amplifying a voltage between both ends of the third capacitor C4, and a seventh switching circuit SW7 connected to the output terminal of the amplifier 2.

The output of the amplifier 2 is supplied to the signal line not shown, via the seventh switching circuit SW7. The pixel TFT is connected to the signal line. When the scanning line connected to the gate terminal of the pixel TFT becomes high level, the pixel TFT turns on and the electric charge in accordance with the voltage on the signal line is accumulated to a liquid crystal capacitor and a supplementary capacitor. In FIG. 1, these capacitors are represented by the fourth capacitor C5.

The first switching circuits (SW11, SW12), (SW13, SW14) and (SW15, SW16) of FIG. 1 are composed of switches SW11, SW13 and SW15 to one ends of which the first voltage V1 are applied, and switches SW12, SW14 and SW16 to one ends of which the second voltage V2 are applied. The respective other ends of two switches in the first switching circuit are connected commonly. In FIG. 1, these common connecting points are expressed by b2, b1 and b0, respectively.

The first switching circuits (SW11, SW12), (SW13, SW14) and (SW15, SW16) correspond to the respective bits of the digital signals (b2, b1, b0). The corresponding first switching circuit turns on/off in accordance with the value of each bit. For example, when the bit value is "1", one of the switches SW12, SW14 and SW16 turns on. When the bit value is "0", one of the switches SW11, SW13 and SW15 turns on. Ends b2, b1 and b0 of the first switching circuit become either the first voltage V1 or the second voltage V2.

Figure 2:
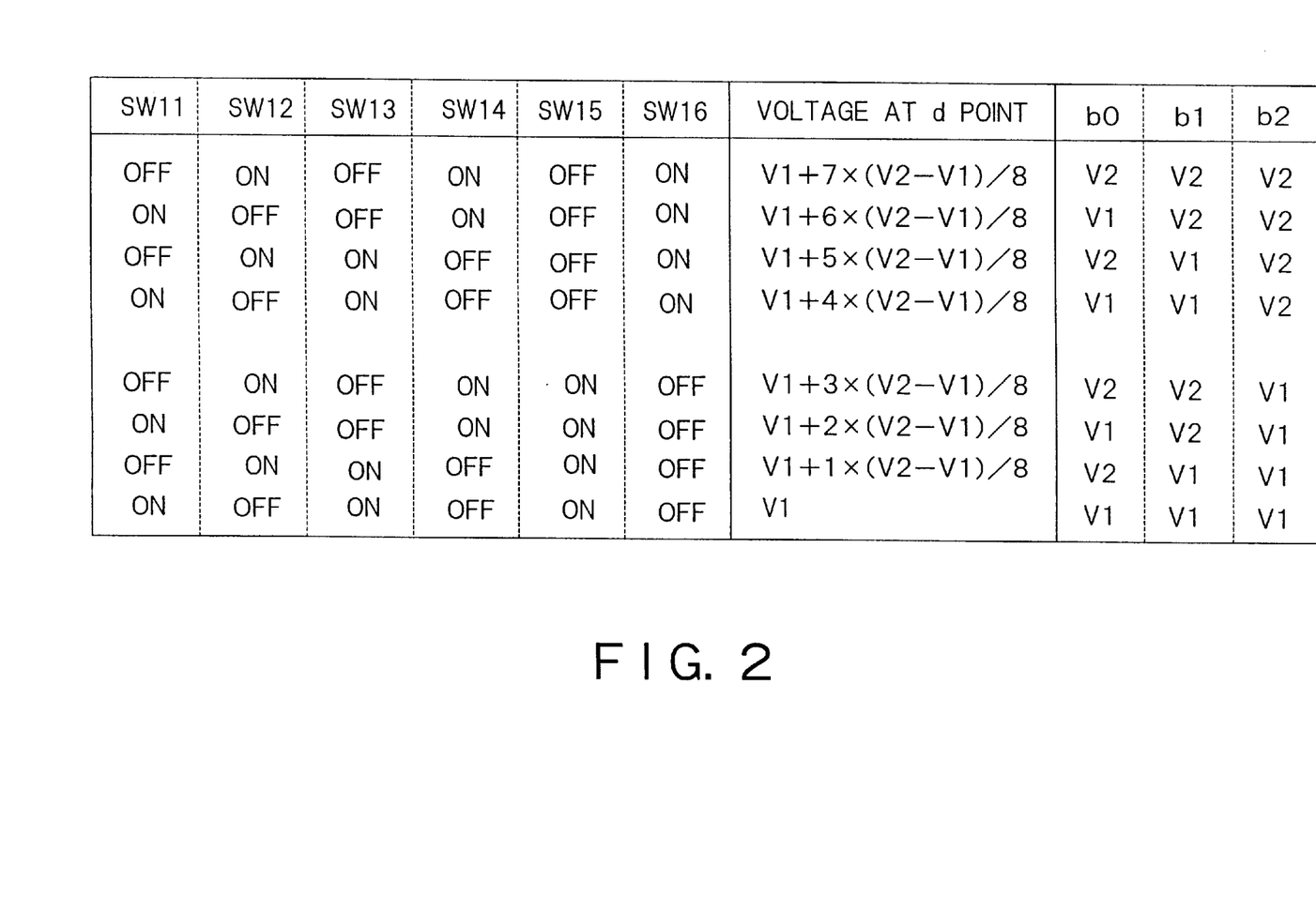
FIG. 2 is a diagram showing a relationship between ON/OFF of the first switching circuits, the voltage of the ends b2, b1 and b0 of the first switching circuits, and the voltage of one end d of the third capacitor C4.

FIG. 2 is a diagram showing a relationship between ON/OFF of the first switching circuits (SW11, SW12), (SW13, SW14) and (SW15, SW16), the voltage of the ends b2, b1 and b0 of the first switching circuits (SW11, SW12), (SW13, SW14) and (SW15, SW16), and the voltage of one end d of the third capacitor C4. As shown in FIG. 2, when the voltages of b2, b1 and b0 are in (V2, V2, V2), the d point becomes the maximum voltage $\{V1+7*(V2-V1)/8\}$. When the voltages of b2, b1 and b0 are in (V1, V1, V1), the d point becomes the minimum voltage V1.

The charge control circuit 1 controls ON/OFF of each switch in the first switching circuits (SW11, SW12), (SW13, SW14) and (SW15, SW16) in accordance with the value of the digital signals (b2, b1, b0). The d point of FIG. 1 outputs the voltage in accordance with the value of the digital signals (b2, b1, b0).

Figure 3:
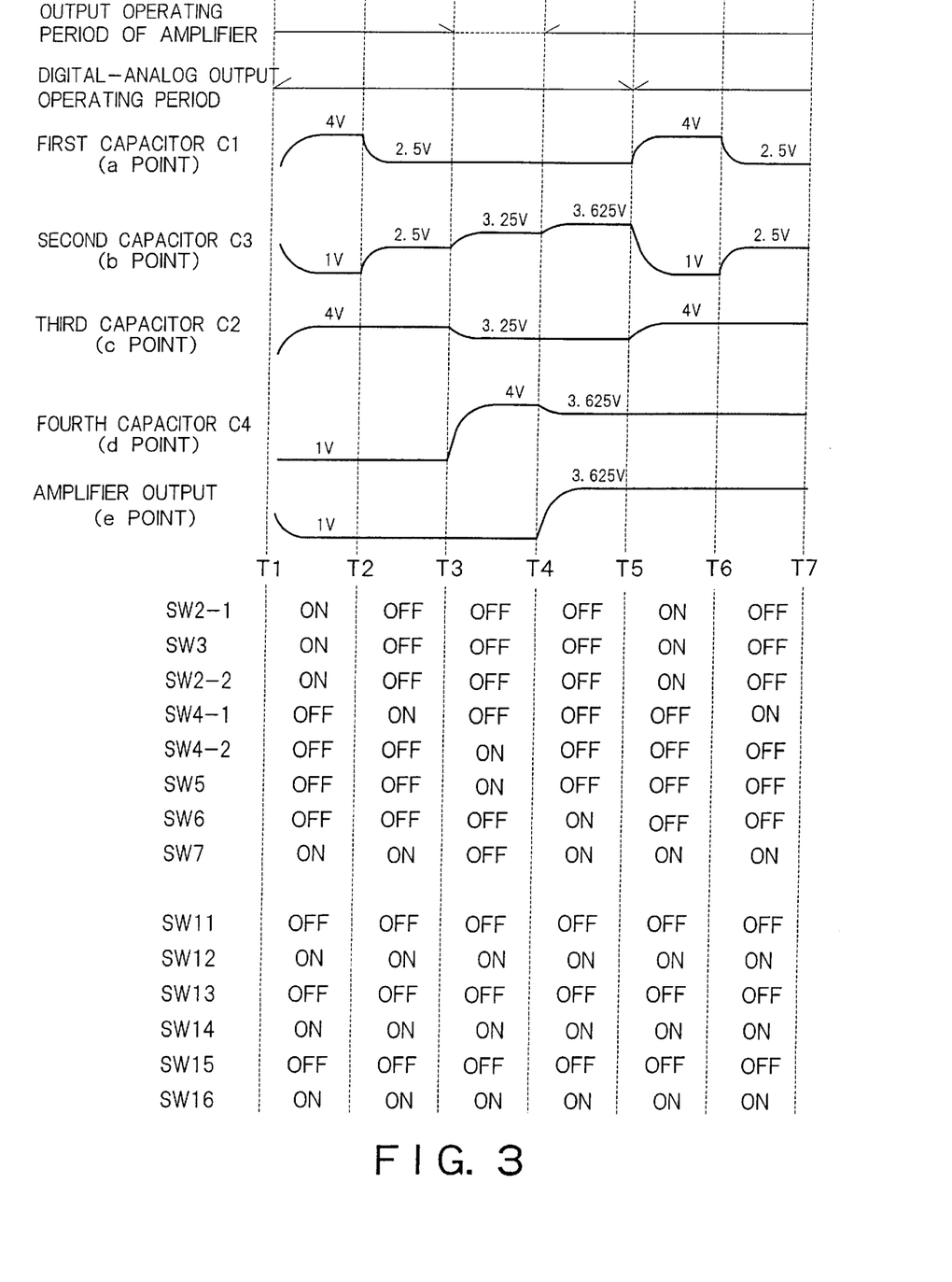
FIG. 3 is a diagram showing voltage waveforms of the respective portions in the circuit of FIG. 1.

FIG. 3 is a diagram showing voltage waveforms of the respective portions in the circuit of FIG. 1. The diagram of FIG. 3 shows an example in the case where the voltages of b2, b1 and b0 are in (V2, V2, V2), that is, the digital pixel data is (1, 1, 1). Hereinafter, the operation of the digital analog converting circuit of FIG. 1 will be described based on the voltage waveforms diagram of FIG. 3. In FIG. 3, the first voltage V1 is in 1V, and the second voltage V2 is in 4V.

First of all, during time period T1–T2, the charge control circuit 1 turns on the second switching circuits SW2-1, SW3 and SW2-2, and the seventh switching circuit SW7. Therefore, one ends (a, c) of the capacitors C1 and C2 become the voltage V2, and one end b of the capacitor C3 becomes the voltage V1.

Subsequently, during time period T2–T3, the charge control circuit 1 turns on the fourth switching circuit SW4-1 and the seventh switching circuit SW7. Therefore, the respective one ends (a, b) of the capacitors (C1, C3) become the same voltage (2.5V). The voltage is the intermediate voltage between 4V and 1V.

Subsequently, during time period T3–T4, the charge control circuit 1 turns on the fifth switching circuits SW4-2 and SW5. Therefore, one end d of the capacitor C4 becomes the voltage V2. Furthermore, the electric charge moves from the capacitor C2 to the capacitor C3, and the respective one ends (b, c) of the capacitors (C2, C3) become the same voltage (3.25V).

Subsequently, during time period T4–T5, the charge control circuit 1 turns on the fourth and seventh switching circuits SW6 and SW7. Therefore, the electric charge moves from the capacitor C3 to the capacitor C4, and the respective one ends (b, d) of the capacitors (C3, C4) become the same voltage (3.625V). One end e of the seventh switching circuit SW7 also becomes 3.625V.

After time T5, the same operation as that of time period T1–T5 is carried out.

Thus, according to the first embodiment, the electric charge in accordance with the value of the digital pixel data is accumulated to the capacitor C3, and then when the accumulation of the electric charge is finished, the switch SW6 turns on and the electric charge is transmitted. Therefore, during OFF period of the switching circuit SW6, the capacitor C4 can hold the electric charge in accordance with the prior pixel data. Accordingly, the time for supplying the voltage to the signal line provided to the subsequent stage of the digital-analog converting circuit becomes long, thereby avoiding a problem that the voltage of the signal line does not rise or lower fully, and improving display quality.

(Second Embodiment)

In the first embodiment, the analog voltage changing linearly, generated by equally dividing the first and second voltages has been generated. When the generated analog voltage is used for the signal line drive of the liquid crystal display, either the maximum voltage or the minimum voltage of the signal line voltage has to be set to nonlinear voltage. The reason is why voltage transmittance property of the liquid crystal is nonlinear. In a second embodiment described below, when the digital pixel data is converted into the analog voltage, the analog voltage corresponding to the maximum value or the minimum voltage of the digital pixel data is adjusted to a nonlinear voltage value.

Figure 4:
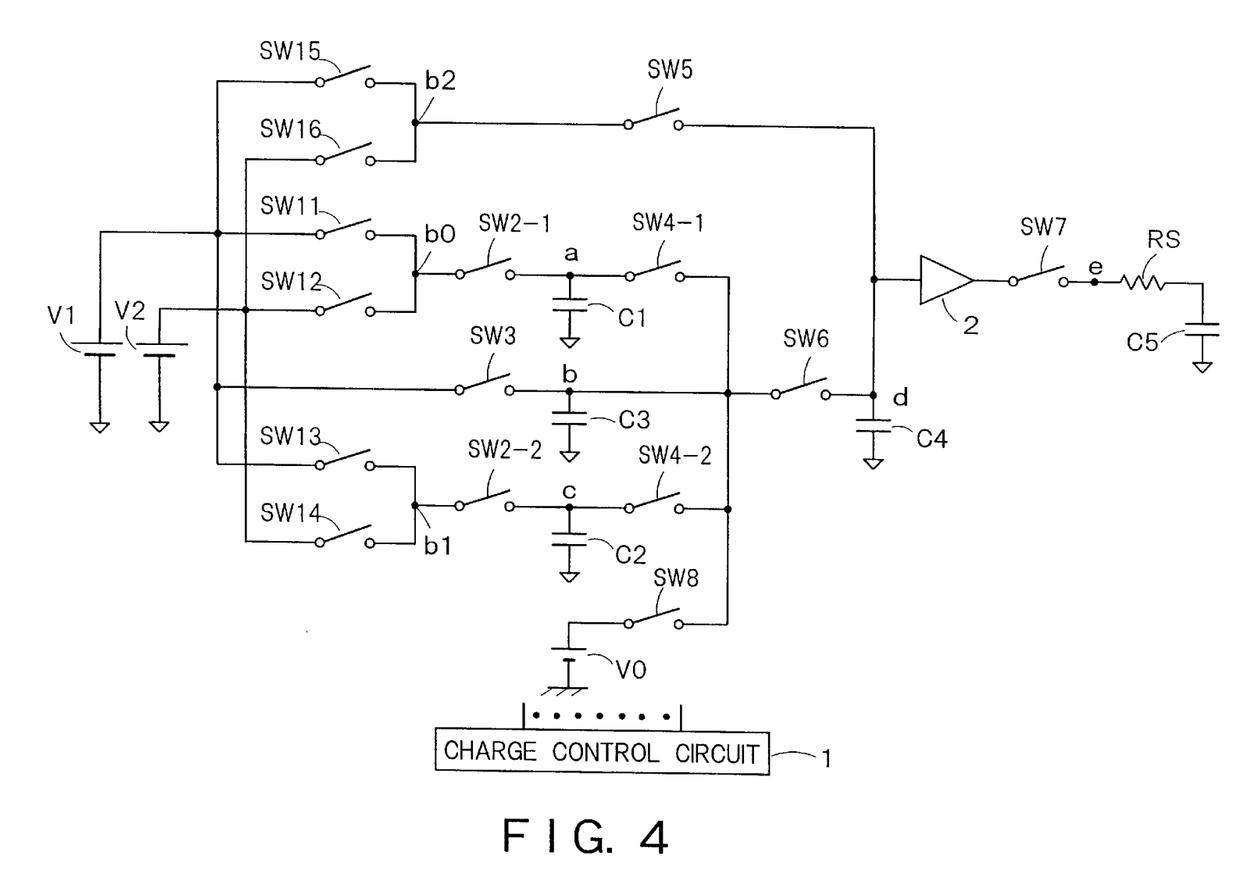
FIG. 4 is a circuit diagram of the second embodiment of the digital-analog converting circuit according to the present invention.

FIG. 4 is a circuit diagram of the second embodiment of the digital-analog converting circuit according to the present invention. In FIG. 4, the same reference numerals are attached to constituents common to those of FIG. 1. Hereinafter, points different from FIG. 1 will be described mainly.

The digital-analog converting circuit of FIG. 4 has an eighth switching circuit SW8 added to constituents of FIG. 1. A power supply voltage V0 is applied to one end of the eighth switching circuit SW8. The fourth switching circuits (SW4-1, SW4-2), the fifth switching circuit SW5 and the sixth switching circuit SW6 are connected to other end of the eighth switching circuit SW8.

The eighth switching circuit SW8 turns on when the digital pixel data is in the minimum value, it turns off when the digital pixel data is not in the minimum value.

Figure 5:
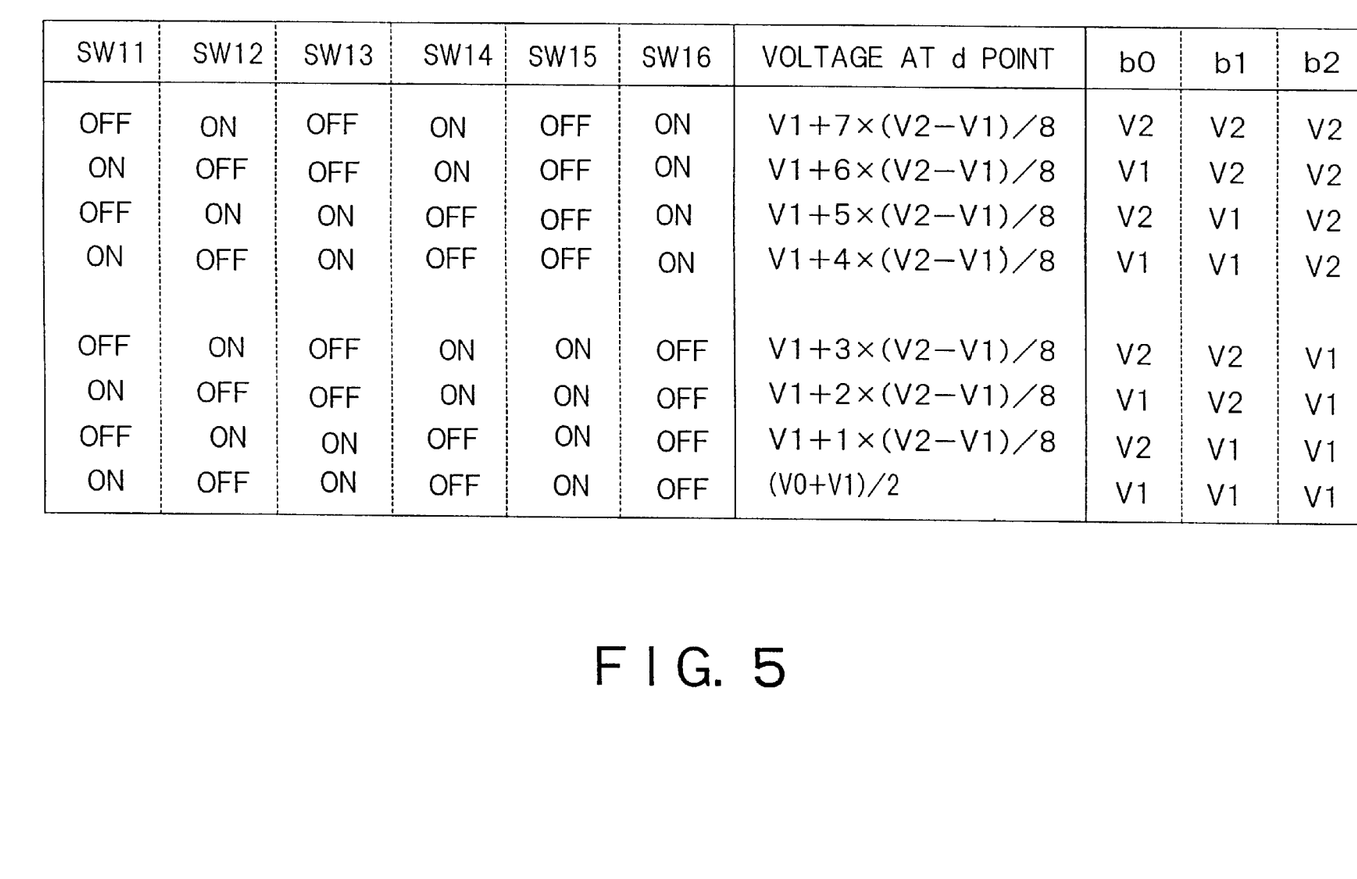
FIG. 5 is a diagram showing a relationship between ON/OFF of the first switching circuits, the voltage of (b2,b1, b0) points, and one end d of the third capacitor C4.

FIG. 5 is a diagram showing a relationship between ON/OFF of the first switching circuits (SW11, SW12), (SW13, SW14) and (SW15, SW16), the voltage of (b2,b1, b0) points, and one end d of the third capacitor C4. When the voltages of (b2, b1, b0) points are in (V1, V1, V1), that is, the digital pixel data is the minimum value, the d point becomes (V0+V1)/2. Except for the case, the d point becomes the same voltage as that of FIG. 2.

Figure 6:
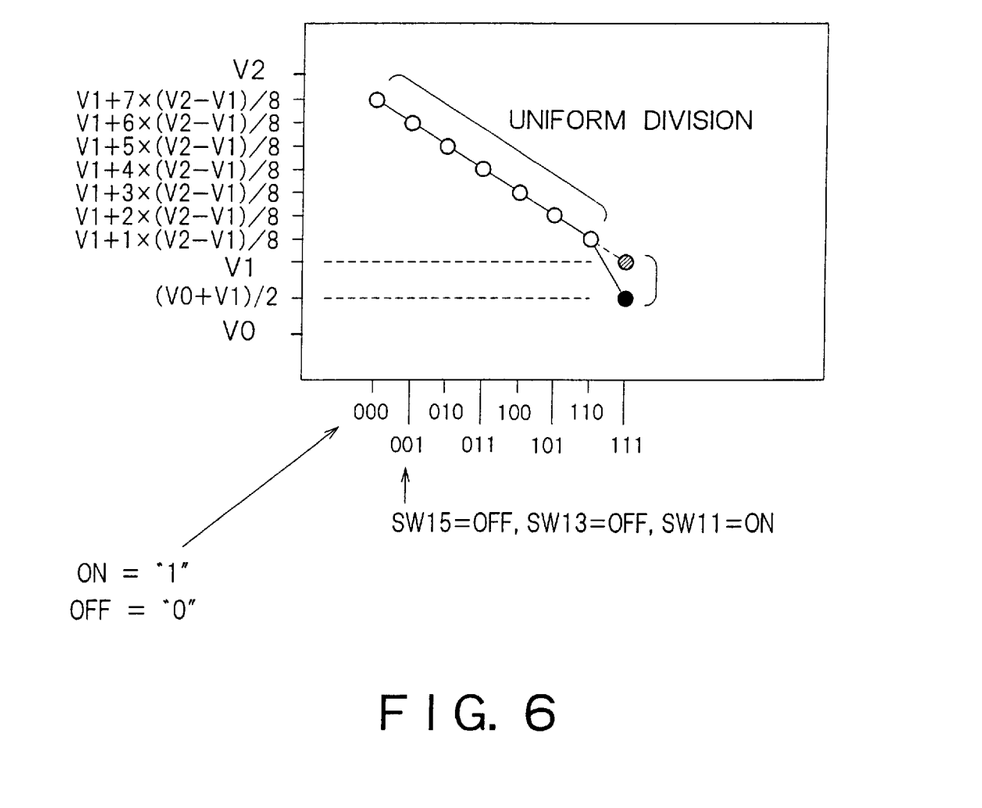
FIG. 6 is a diagram showing voltage change of the d point in accordance with the digital pixel data.

FIG. 6 is a diagram showing voltage change of the d point in accordance with the digital pixel data. In FIG. 6, the analog voltage in the case where the digital pixel data is in the minimum value is expressed by black circle, and the analog voltages corresponding to another digital pixel data are expressed by white circles. The analog voltage corresponding to the minimum voltage in the first embodiment is expressed by a hatched circle as a reference.

As shown in FIG. 6, in the first embodiment, the analog voltage always has linear properties. In the second embodiment, the analog voltage has nonlinear properties when the digital pixel data is in the minimum value.

Figure 7:
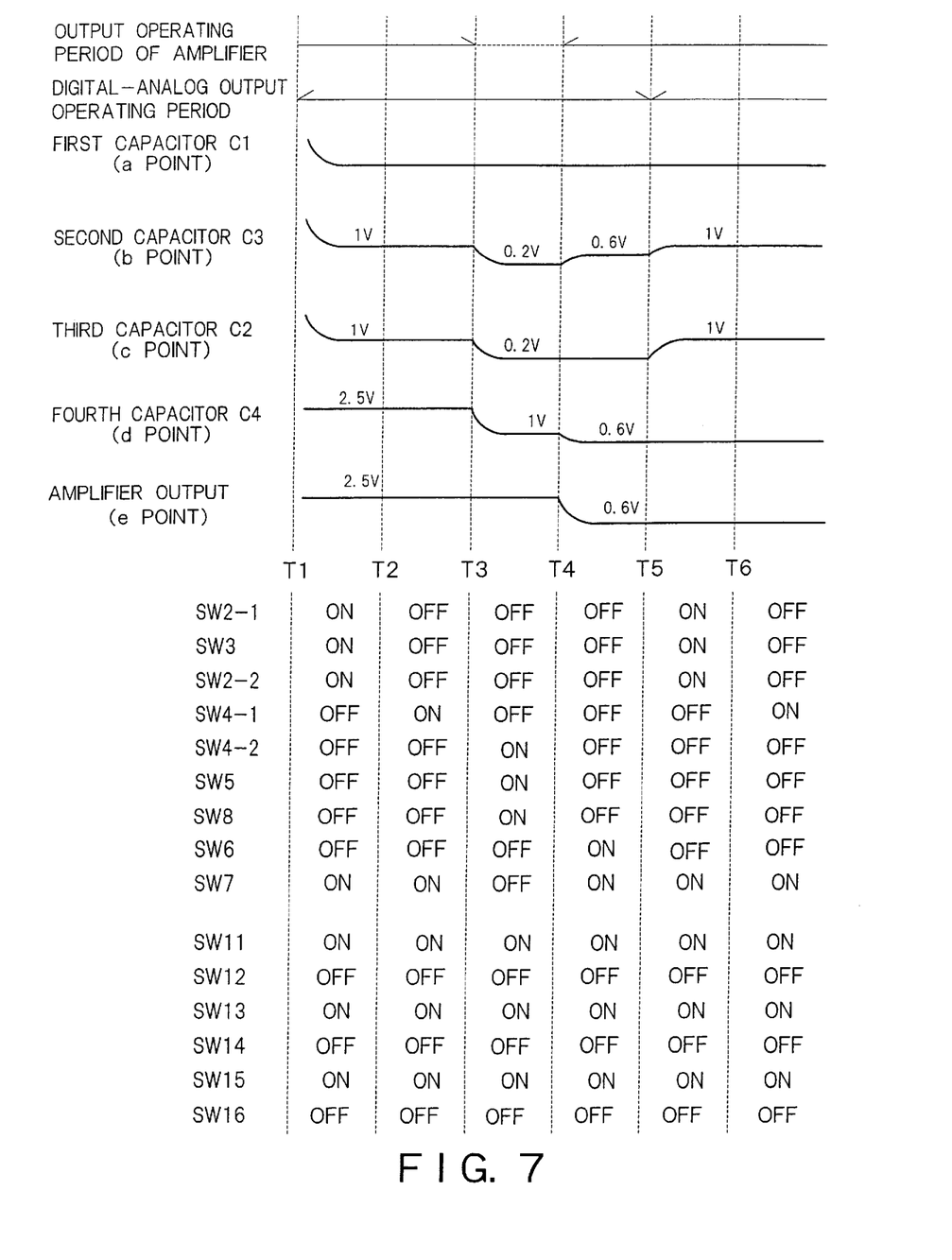
FIG. 7 is a diagram showing voltage waveforms of the respective portions in the circuit of FIG. 4.

FIG. 7 is a diagram showing voltage waveforms of the respective portions in the circuit of FIG. 4. The diagram of FIG. 7 shows an example in the case where the voltages of (b2, b1, b0) are in (V1, V1, V1), that is, the digital pixel data is in (0, 0, 0). At this time, it is assumed that the eighth switch SW8 turns on, the first voltage V1 is in 1V, the second voltage V2 is in 4V, and the third voltage V0 is in (−0.6V).

First of all, during time period T1–T2, the charge control circuit 1 turns on the second switching circuits (SW2-1, SW2-2), and the third switching circuit SW3. Therefore, (a, b, c) points become 1V.

Subsequently, during time period T2–T3, the charge control circuit 1 turns on the fourth switching circuit SW4-1. Therefore, although redistribution of the electric charge is performed between the capacitors C1 and C3, because the amount of the electric charge accumulated to the capacitors C1 and C3 is equal, the voltages of a and b points are maintained to 1V.

Subsequently, during time period T3–T4, the charge control circuit 1 turns on the fourth switching circuit SW4-2, the fifth switching circuit SW5 and the eighth switching circuit SW8. Therefore, redistribution of the electric charge is performed between the capacitors C2 and C3. As a result, the voltage of b and c points become (1−0.6)/2=0.2V. The electric charge in accordance with the first voltage V1 is accumulated to the capacitor C4, and the d point becomes 1V.

Subsequently, during time period T4–T5, the charge control circuit 1 turns on the sixth and seventh switching circuits SW6 and SW7. Therefore, redistribution of the electric charge is performed between the capacitors C3 and C4, and the d and e points become (1+0.2)/2=0.6V.

After time T5, the operation during time period T1–T5 is repeated.

Figure 8:
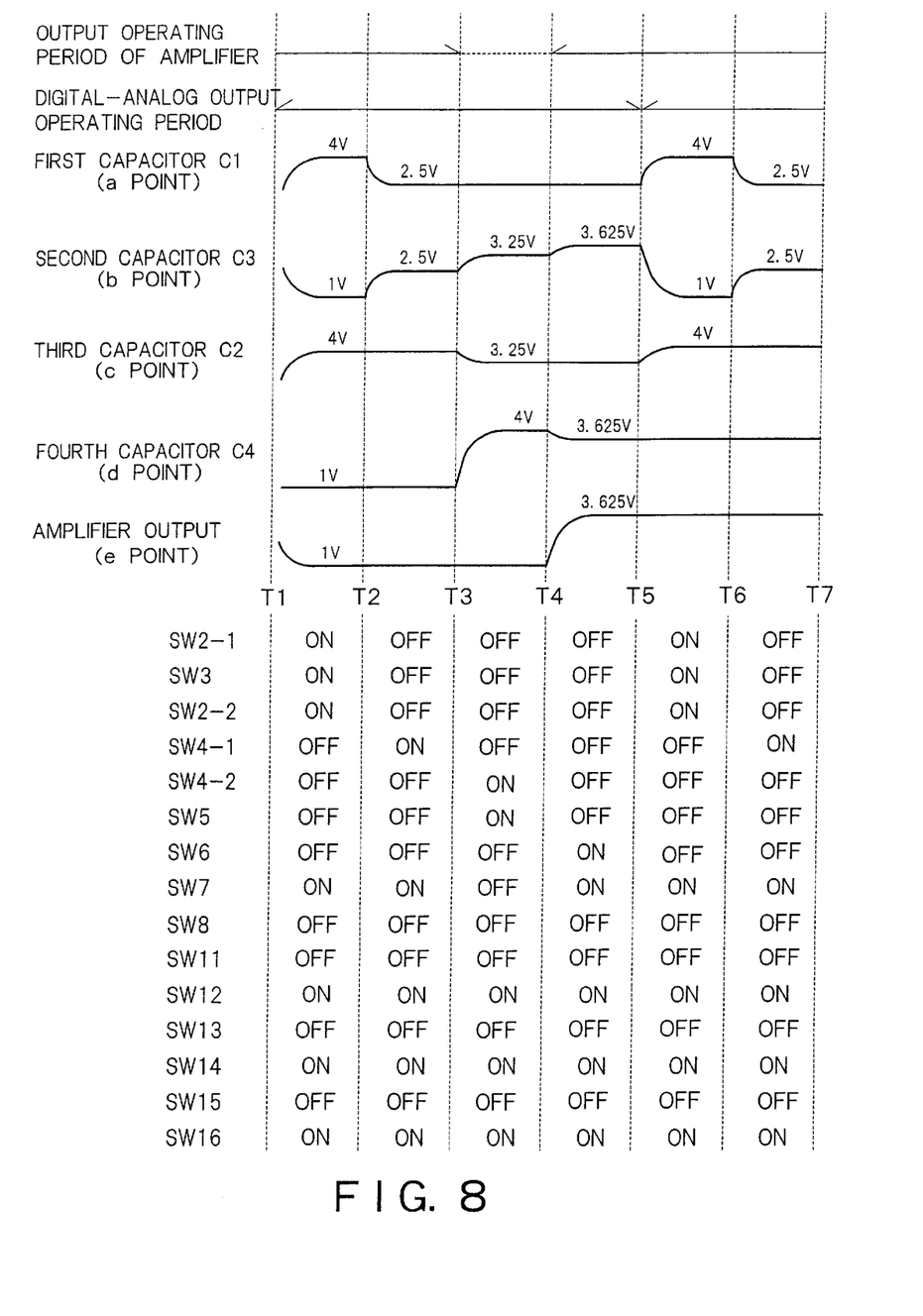
FIG. 8 is a diagram showing waveforms in the case where the voltages of (b2, b1, b0) points are in (V2, V2, V2).

On the other hand, the diagram showing voltage waveform of FIG. 8 shows an example in the case where the voltages of (b2, b1, b0) points are in (V2, V2, V2), that is, the pixel data is in (1, 1, 1). At this time, it is assumed that the eighth switching circuit SW8 turns off.

At this case, because the eighth switching circuit SW8 is in OFF, the circuit of FIG. 8 operates in the same way as that of FIG. 1. During time period T4–T5, the respective one ends of the capacitors C3 and C4 and one end e of the seventh switching circuit SW7 become 3.625V.

Thus, in the second embodiment, when the digital pixel data is in the minimum value, the eight switching circuit SW8 turns on. Because of this, it is possible to adjust the analog voltage corresponding to the minimum value to nonlinear voltage. Accordingly, even if the voltage transmittance property of the liquid crystal is not linear, it is possible to supply the most suitable voltage for the properties of the liquid crystal, thereby improving display quality.

In the above embodiment, an example in which the eighth switching circuit SW8 turns on when the digital pixel data is in the minimum value has been described. However, when the digital pixel data is in the maximum value, the eighth switching circuit may turn on in order to adjust the analog voltage. Thus, according to the second embodiment, it is possible to carry out adjustment processings suitable to the voltage transmittance property of the liquid crystal.

In FIG. 1 and FIG. 4, the example in which the digital pixel data of 3 bits is converted into the analog voltage has been described. The number of bits of the digital pixel data is not limited to 3 bits. For example, in order to convert the digital pixel data of n bits into the analog voltage, the second switching circuits (SW2-1, SW2-2), the first capacitor (C1, C2) and the fourth switching circuit (SW4-1, SW4-2) may be provided by each (n–1) pieces.

The digital-analog converting circuit of FIG. 1 and FIG. 4 can be used besides the display device. The digital-analog converting circuit according to the present invention may be composed without using the poly-silicon TFT.

What is claimed is:

1. A digital-analog converting circuit having an input terminal and an output terminal, and configured to output a voltage between a first and second voltages, said voltage corresponding to a digital signal of n bits (n is an integer more than two), comprising:
   a plurality of first capacitors configured to accumulate electric charges in accordance with values of respective bits, except for a most significant bit, of the n bits of said digital signal;
   a second capacitor configured to accumulate an electric charge corresponding to said first voltage and a charge accumulated in said plurality of first capacitors;
   a third capacitor configured to accumulate an electric charge corresponding to the value of the most significant bit of said digital signal and a charge accumulated in the second capacitor;
   a switching circuit connecting said input, said output, said plurality of first capacitors, said second capacitor, and said third capacitor; and
   a charge control circuit configured to control charging of the plurality of first capacitors, transferring electric charges from the plurality of first capacitors into said second capacitor, charging said third capacitor with a charge corresponding to the most significant bit of said third capacitor, and transferring electric charges from said second capacitor into said third capacitor.

2. The digital-analog converting circuit according to claim 1, further comprising:
   an amplifier configured to amplify a voltage output from said third capacitor; and
   an output switching circuit configured to operate an output switch connecting an output terminal of said amplifier to an output terminal of said digital-analog converting circuit,
   wherein said charge control circuit controls said output switching circuit to shut the output switch when the charge corresponding to the value of the most significant bit of said digital signal is accumulating in said third capacitor, and open the output switch when the charge in according to the value of the most significant bit of said digital signal is not accumulating in said third capacitor.

3. The digital-analog converting circuit according to claim 1, said charge control circuit further comprising:
   a charge control circuit configured to transfer electric charges accumulated in each of said first capacitors sequentially into said second capacitor during a first transfer period, and to transfer the electric charge corresponding to the value of the most significant bit of said digital signal to said third capacitor during at least a portion of the first transfer period.

4. The digital-analog converting circuit according to claim 1, further comprising:
   a charge adjusting circuit configured to adjust an amount of the electric charge accumulated to said second capacitor, only when said digital signal of n bits is a prescribed bit string,
   wherein said charge control circuit controls said charge adjusting circuit.

5. The digital-analog converting circuit according to claim 4, wherein said charge adjusting circuit adjusts the amount of the electric charge accumulated in said second capacitor in correspondence with a digital signal minimum value and a digital signal maximum value.

6. The digital-analog converting circuit according to claim 4,
   wherein said charge adjusting circuit has a reference voltage source and a voltage switching circuit connecting said switching circuit, said second capacitor, and said reference voltage source,
   wherein said voltage switching circuit turns on during a portion of a time period corresponding to the transfer of the electric charge accumulated in each of said plurality of first capacitors into said second capacitor in order to adjust the amount of the electric charge accumulated in said second capacitor.

7. The digital-analog converting circuit according to claim 4, wherein said voltage switching circuit turns on during at least a portion of a time period corresponding to transfer the electric charge accumulated in one of said plurality of first capacitors into said second capacitor in order to adjust the amount of the electric charge accumulated to said second capacitor.

8. The digital-analog converting circuit according to claim 1, wherein said first voltage is a voltage lower than said second voltage.

9. A display device, comprising:
   a plurality of switching elements arranged near cross sections of signal lines and scanning lines;
   a signal line drive circuit configured to drive the signal lines; and
   a scanning line drive circuit configured to drive the scanning lines;
   wherein said signal line drive circuit has said digital-analog converting circuit according to claim 1 configured to convert a digital signal expressing pixel information into an analog signal;
   wherein an output of said digital-analog converting circuit is supplied to the corresponding signal line.

10. A digital-analog converting circuit having an input terminal and an output terminal, and configured to output a voltage between a first and second voltages, said voltage corresponding to a digital signal of n bits (n is an integer more than two), comprising:

a plurality of first switching circuits corresponding to the n bits of said digital signal, said plurality of first switching circuits configured to select either of said first or second voltage in accordance with a value of a corresponding bit;
a plurality of second switching circuits, each of said plurality of second switching circuits connected to a corresponding one of said plurality of first switching circuits, except for one first switching circuit corresponding to a most significant bit of said digital signal;
a plurality of first capacitors configured to accumulate electric charges corresponding to values of respective bits, except for the most significant bit, of the n bits of said digital signal;
a second capacitor configured to accumulate an electric charge corresponding to said first voltage;
a third switching circuit configured to connect said first voltage to said second capacitor;
a plurality of fourth switching circuits configured to connect respective first capacitors to said second capacitor;
a third capacitor configured to accumulate an electric charge corresponding to a value of the most significant bit of said digital signal and a charge accumulated in said second capacitor;
a fifth switching circuit configured to connect an electric charge corresponding to the value of the most significant bit of said digital signal to said third capacitor;
a sixth switching circuit configured to connect said second capacitor to said third capacitor; and
a charge control circuit configured to control on said second switching circuit in order to accumulate electric charges in corresponding to values of respective bits, except for the most significant bit, of said digital signal to the respective first capacitors, control said third switching circuit in order to accumulate the electric charge corresponding to said first voltage in said second capacitor, control said fourth switching circuits in order to transfer the electric charge accumulated in respective first capacitors to the second capacitor, and turn on said fifth switch circuit in order to accumulate the electric charge corresponding to the value of the most significant bit of said digital signal in said third capacitor, and control on said sixth switching circuit in order to transfer an electric charge accumulated in said second capacitor into said third capacitor.

11. The digital-analog converting circuit according to claim 10, further comprising:
an amplifier configured to amplify a voltage output from said third capacitor; and
a seventh switching circuit connected to the output terminal of said amplifier;
wherein said charge control circuit turns off said seventh switching circuit during an ON period of said fifth switching circuit, and turns on said seventh switching circuit during an OFF period of said fifth switching circuit.

12. The digital-analog converting circuit according to claim 10, wherein said charge control circuit turns on one by one each of said plurality of said second switching circuits.

13. The digital-analog converting circuit according to claim 10, further comprising:
a charge adjusting circuit configured to adjust an amount of the electric charge accumulated to said second capacitor,
wherein said charge control circuit first controls said charge adjusting circuit.

14. The digital-analog converting circuit according to claim 13, wherein said charge adjusting circuit adjusts the amount of the electric charge accumulated in said second capacitor in correspondence with a digital signal minimum value and a digital signal maximum value.

15. The digital-analog converting circuit according to claim 13,
wherein said charge adjusting circuit has a reference voltage source and a voltage switching circuit connecting said switching circuit, said second capacitor, and said reference voltage source,
wherein said voltage switching circuit turns on during a portion of a time period corresponding to the transfer of the electric charge accumulated in each of said plurality of first capacitors into said second capacitor in order to adjust the amount of the electric charge accumulated to said second capacitor.

16. The digital-analog converting circuit according to claim 13, wherein said voltage switching circuit turns on during at least a portion of a time period corresponding to a transfer of the electric charge accumulated in one of said plurality of first capacitor into said second capacitor in order to adjust the amount of the electric charge accumulated to said second capacitor.

17. The digital-analog converting circuit according to claim 10, wherein said first voltage is a voltage lower than said second voltage.

18. A display device, comprising:
a plurality of switching elements arranged near cross sections of signal lines and scanning lines;
a signal line drive circuit configured to drive the signal lines; and
a scanning line drive circuit configured to drive the scanning lines;
wherein said signal line drive circuit has said digital-analog converting circuit according to claim 10 configured to convert a digital signal expressing pixel information into an analog signal;
wherein an output of said digital-analog converting circuit is supplied to the corresponding signal line.

19. A digital-analog converting method for outputting a voltage between a first and second voltages, said voltage corresponding to a digital signal of n bits (n is an integer more than two), comprising:
accumulating electric charges in accordance with respective bits, except for a most significant bit, of said n bits of said digital signal in respective first capacitors;
transferring the electric charges accumulated in the respective first capacitors into a second capacitor;
accumulating an electric charge corresponding to the most significant bit of said digital signal in a third capacitor; and
transferring an electric charge accumulated in said second capacitor into said third capacitor.

20. A digital-analog converting method for outputting a voltage between a first and second voltages, said voltage corresponding to a digital signal of n bits (n is an integer more than two), comprising:
accumulating electric charges in accordance with respective bits, except for a most significant bit, of said n bits of said digital signal in respective first capacitors;
transferring the electric charges accumulated in the respective first capacitors into a second capacitor;
performing a charge adjustment;
accumulating an electric charge corresponding to the most significant bit of said digital signal in said third capacitor; and
transferring an electric charge accumulated in said second capacitor into said third capacitor.

* * * * *